United States Patent
Tanaka et al.

(10) Patent No.: US 9,418,908 B2
(45) Date of Patent: Aug. 16, 2016

(54) WAFER PROCESSING METHOD

(71) Applicant: DISCO CORPORATION, Tokyo (JP)

(72) Inventors: Makoto Tanaka, Tokyo (JP); Xin Lu, Tokyo (JP); Sax Liao, Hsinchu (TW)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/811,470

(22) Filed: Jul. 28, 2015

(65) Prior Publication Data

US 2016/0035635 A1  Feb. 4, 2016

(30) Foreign Application Priority Data

Jul. 30, 2014  (JP) ................................ 2014-155179

(51) Int. Cl.
 *H01L 21/66* (2006.01)
 *H01L 21/78* (2006.01)
 *H01L 21/304* (2006.01)

(52) U.S. Cl.
 CPC .............. *H01L 22/20* (2013.01); *H01L 21/304* (2013.01); *H01L 21/78* (2013.01)

(58) Field of Classification Search
 CPC ........ H01L 22/20; H01L 21/78; H01L 23/585
 USPC ............................................................ 427/7
 See application file for complete search history.

(56) References Cited

U.S. PATENT DOCUMENTS

| | | | | |
|---|---|---|---|---|
| 7,977,232 B2* | 7/2011 | Eto | .................. | H01L 23/585 257/383 |
| 2004/0161940 A1* | 8/2004 | Daii | .................. | H01L 21/02046 438/706 |
| 2007/0187802 A1* | 8/2007 | Kurosawa | ................ | H01L 21/78 257/618 |
| 2007/0231929 A1* | 10/2007 | Kajiyama | ......... | H01L 21/67092 438/6 |
| 2009/0186465 A1* | 7/2009 | Fujisawa | .................. | H01L 21/78 438/462 |
| 2009/0191690 A1* | 7/2009 | Boyle | ...................... | H01L 21/78 438/462 |
| 2009/0197351 A1* | 8/2009 | Morikazu | .............. | B23K 26/03 438/5 |
| 2011/0212574 A1* | 9/2011 | Sekiya | .................. | H01L 21/561 438/113 |
| 2011/0312157 A1* | 12/2011 | Lei | .......................... | H01L 21/78 438/462 |
| 2012/0244682 A1* | 9/2012 | Tanaka | ............... | B23K 26/0057 438/464 |
| 2013/0049195 A1* | 2/2013 | Wu | .......................... | H01L 24/97 257/738 |
| 2014/0203410 A1* | 7/2014 | Zhang | ...................... | H01L 21/78 257/620 |

FOREIGN PATENT DOCUMENTS

JP   4-99607   3/1992

* cited by examiner

*Primary Examiner* — Moazzam Hossain
(74) *Attorney, Agent, or Firm* — Greer Burns & Crain, Ltd.

(57) ABSTRACT

A wafer processing method includes a first correction step of measuring a distance "a" between a first cut groove previously formed by a first cutting unit and a division line for the next cut groove, and correcting an actual index amount by using a deviation "b" of the first cutting unit equivalent to the difference between the distance "a" and a proper index amount of the first cutting unit, and a second correction step of forming a measurement groove by using a second cutting unit along the division line for the next cut groove, measuring a distance "c" between the first cut groove and the measurement groove, and correcting an actual index amount of the second cutting unit by using a deviation "d" equivalent to the difference between the distance "c" and a proper index amount of the second cutting unit during the cutting step.

5 Claims, 5 Drawing Sheets

FIG. 1

WAFER PROCESSING METHOD

BACKGROUND OF THE INVENTION

1. Field of the Invention

The present invention relates to a wafer processing method using two kinds of cutting blades.

2. Description of the Related Art

In cutting a wafer having a TEG (Test Elements Group), metal film, etc. in an area superimposed on each division line (street) from the front side of the wafer by using a cutting blade, the cutting blade is prone to be clogged, causing large chipping on the back side of the wafer. To cope with this problem, there is a case that a method called step cutting is adopted in dividing such a wafer. The step cutting includes the steps of using a first cutting blade having a large width (thick blade) to form a shallow groove as removing the TEG etc. and next using a second cutting blade having a small width (thin blade) to further cut the wafer along the above shallow groove, thereby dividing the wafer.

Further, in cutting a wafer by using a cutting blade, any factor such as heat generated during cutting may vary the amount (index amount) of indexing of the cutting blade in a direction perpendicular to each division line. If such a variation in index amount is left, the deviation of the cutting blade from each division line is gradually increased to cause a reduction in accuracy of processing of the wafer. To cope with this problem, there has been proposed a method including the steps of identifying the position of a previously formed groove on the basis of a characteristic target pattern exposed to the front side of a wafer and correcting the index amount in the case that the position of the groove is deviated from a proper position, thereby maintaining the processing accuracy for the wafer (see Japanese Patent Laid-open No. Hei 4-99607, for example).

SUMMARY OF THE INVENTION

In recent years, attention has been paid to WL-CSP (Wafer Level Chip Size Package) such that packaging is performed in the condition of a wafer. In the WL-CSP, a redistribution layer and electrodes are provided in each device formed on the front side of the wafer, and the front side of the wafer is sealed with resin or the like. Thereafter, the wafer sealed with the resin is divided into the devices by cutting or any other methods. However, a wide area of the front side of the wafer is covered with the resin, so that the number of exposed target patterns is small. Accordingly, there is a problem such that the index amount cannot be corrected with arbitrary timing in the past method. Further, the position of the groove is identified on the basis of the target pattern in the past method. Accordingly, if the target pattern itself is defective, the accuracy of correction is reduced. In this respect, it is desirable to realize a method capable of correcting the index amount more reliably with high accuracy.

It is therefore an object of the present invention to provide a wafer processing method which can correct the index amount with arbitrary timing and more reliably with high accuracy.

In accordance with an aspect of the present invention, there is provided a wafer processing method for cutting a wafer by using a cutting apparatus, the front side of the wafer being partitioned by a plurality of crossing division lines into a plurality of separate regions where a plurality of devices are respectively formed, the cutting apparatus including a holding table configured to hold the wafer, first cutting means having a first cutting blade for cutting the wafer held on the holding table, second cutting means having a second cutting blade for cutting the wafer held on the holding table, feeding means for feeding the holding table in an X direction, indexing means for indexing the first cutting means and the second cutting means in a Y direction perpendicular to the X direction according to the pitch of the division lines, and imaging means for detecting a target area of the wafer to be cut, the wafer processing method including an alignment step of identifying the target area of the wafer held on the holding table by using the imaging means; a cutting step of repeating a cutting operation by the first cutting means and the second cutting means with the feeding means and an indexing operation by the indexing means according to the pitch of the division lines after performing the alignment step, thereby forming a first cut groove along each division line by using the first cutting means and forming a second cut groove along the first cut groove by using the second cutting means; a first cutting means correction step of measuring a distance a between the first cut groove previously formed and each division line where the first cut groove is to be next formed, and correcting an actual index amount of the first cutting means by using a deviation "b" of the first cutting means equivalent to the difference between the distance "a" and a proper index amount of the first cutting means during the cutting step; and a second cutting means correction step of forming a measurement groove by using the second cutting means along each division line where the first cut groove is to be next formed, measuring a distance "c" between the first cut groove previously formed and the measurement groove, and correcting an actual index amount of the second cutting means by using a deviation "d" of the second cutting means equivalent to the difference between the distance "c" and a proper index amount of the second cutting means during the cutting step.

Preferably, the measurement groove is formed at only a peripheral portion of the wafer in the second cutting means correction step.

Preferably, the wafer is a package wafer composed of a base wafer and a resin layer sealing the front side of the base wafer in an area except a peripheral portion, the division lines being partially exposed in the peripheral portion of the base wafer so that the division lines can be imaged by the imaging means.

In the wafer processing method according to the present invention, the distance "a" between the first cut groove previously formed and the division line where the first cut groove is to be next formed is measured, and the actual index amount of the first cutting means is corrected by using the deviation "b" equivalent to the difference between the distance "a" and the proper index amount of the first cutting means. Accordingly, it is unnecessary to use the target patterns in correcting the index amount of the first cutting means. Accordingly, even in the case of processing a wafer having a small number of exposed target patterns, the index amount of the first cutting means can be corrected with arbitrary timing. Further, the distance "a" as the actual index amount of the first cutting means is directly measured without the use of the target patterns by a method of imaging the area near the division line, for example. Accordingly, the index amount of the first cutting means can be corrected more reliably with high accuracy.

Further, in the wafer processing method according to the present invention, the measurement groove is formed along the division line where the first cut groove is to be next formed, by using the second cutting means. Thereafter, the distance "c" between the first cut groove previously formed and the measurement groove is measured, and the actual index amount of the second cutting means is corrected by using the deviation "d" equivalent to the difference between the distance "c" and the proper index amount of the second cutting means. Accordingly, it is unnecessary to use the target patterns in correcting the index amount of the second cutting means. Accordingly, even in the case of processing a wafer having a small number of exposed target patterns, the index amount of the second cutting means can be corrected with arbitrary timing. Further, the distance "c" as the actual index amount of the second cutting means is directly measured without the use of the target patterns. Accordingly, the index amount of the second cutting means can be corrected more reliably with high accuracy.

As described above, according to the wafer processing method of the present invention, even in the case of processing a wafer having a small number of exposed target patterns, the index amount can be corrected with arbitrary timing and more reliably with high accuracy.

The above and other objects, features and advantages of the present invention and the manner of realizing them will become more apparent, and the invention itself will best be understood from a study of the following description and appended claims with reference to the attached drawings showing preferred embodiment of the invention.

BRIEF DESCRIPTION OF THE DRAWINGS

FIG. 1 is a schematic perspective view showing the configuration of a cutting apparatus for performing the wafer processing method according to a preferred embodiment of the present invention;

DETAILED DESCRIPTION OF THE PREFERRED EMBODIMENT

Figure 2A:
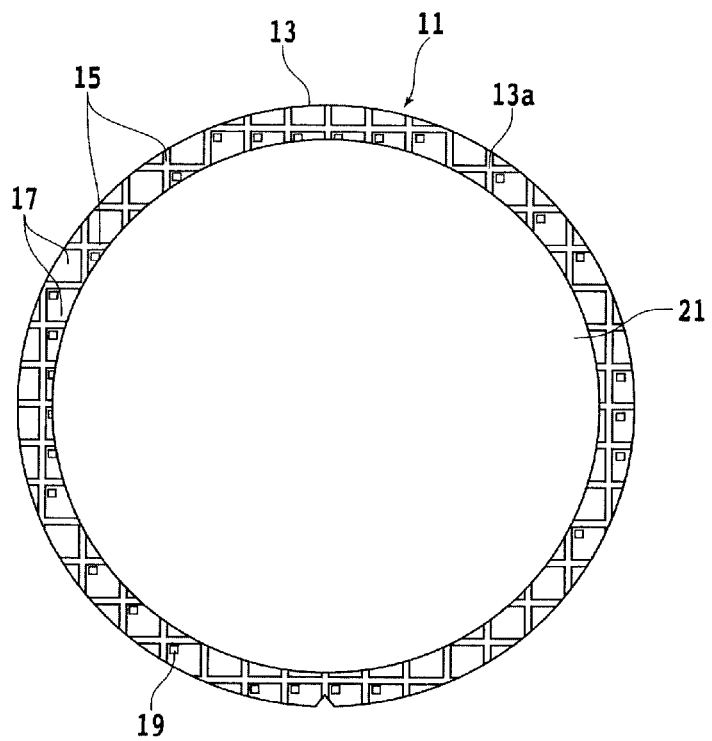
FIG. 2A is a schematic plan view of a wafer.

A preferred embodiment of the present invention will now be described with reference to the attached drawings. The wafer processing method according to this preferred embodiment includes an alignment step, a cutting step (see FIG. 3), a first correction step (first cutting means correction step) (see FIG. 4), and a second correction step (second cutting means correction step) (see FIG. 4). The alignment step is the step of adjusting the orientation of a wafer and allowing the identification of the position of each division line (street) formed on the wafer. The cutting step is the step of cutting the wafer by using a first cutting unit (first cutting means) to form a first cut groove along each division line and further cutting the wafer by using a second cutting unit (second cutting means) to form a second cut groove along each first cut groove. The first correction step is the step of correcting the index amount of the first cutting unit according to the distance between the first cut groove previously formed and the division line where the first cut groove is to be next formed. The second correction step is the step of forming a measurement groove along the division line where the first cut groove is to be next formed, by using the second cutting unit and correcting the index amount of the second cutting unit according to the distance between the first cut groove previously formed and the measurement groove. The first correction step and the second correction step are performed with arbitrary timing during the cutting step. The wafer processing method according to this preferred embodiment will now be described in more detail.

Figure 1:
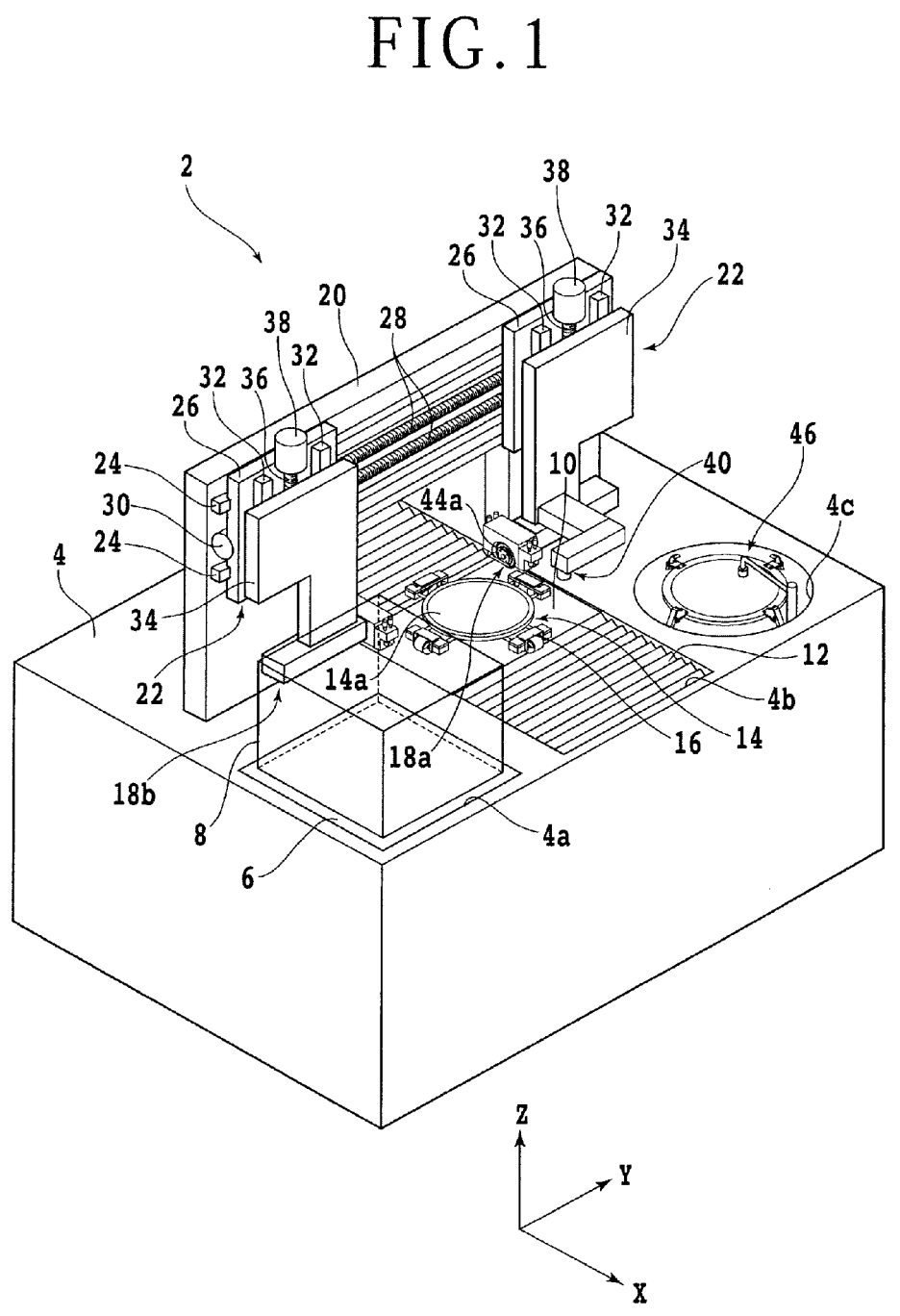

There will first be described a cutting apparatus 2 for performing the wafer processing method according to this preferred embodiment with reference to FIG. 1. FIG. 1 is a schematic perspective view showing the configuration of the cutting apparatus 2. As shown in FIG. 1, the cutting apparatus 2 includes a base 4 for supporting various components. A rectangular opening 4a is formed at a front corner portion of the base 4, and a cassette table 6 is provided in the opening 4a so as to be vertically movable. A boxlike cassette 8 for storing a plurality of wafers is placed on the upper surface of the cassette table 6. In FIG. 1, only the outline of the cassette 8 is shown for convenience of illustration.

The upper surface of the base 4 is formed with a rectangular opening 4b elongated in the X direction shown by an arrow X (in the longitudinal direction or feeding direction). The opening 4b is located on the right side of the cassette table 6 as viewed in FIG. 1. There are provided in this opening 4b an X moving table 10, an X moving mechanism (feeding means) (not shown) for moving the X moving table 10 in the X direction, and a drip-proof dust cover 12 for covering the X moving mechanism. The X moving mechanism includes a pair of parallel X guide rails (not shown) extending in the X direction. The X moving table 10 is slidably mounted on the X guide rails. A nut portion (not shown) is provided on the lower surface of the X moving table 10, and an X ball screw (not shown) parallel to the X guide rails is threadedly engaged with this nut portion. An X pulse motor (not shown) is connected to one end portion of the X ball screw. Accordingly, when the X pulse motor is operated to rotate the X ball screw, the X moving table 10 is moved in the X direction along the X guide rails.

A holding table 14 for holding the wafer under suction is provided above the X moving table 10. Four clamps 16 for fixing an annular frame supporting the wafer are provided on the outer circumference of the holding table 14. The holding table 14 is connected to a rotational drive source (not shown) such as a motor, so that the holding table 14 is rotatable about an axis extending in the Z direction (vertical direction) shown by an arrow Z. The holding table 14 is also movable in the X direction by the X moving mechanism mentioned above. The holding table 14 has a front side (upper surface) functioning as a holding surface 14a for holding the wafer under suction. The holding surface 14a is connected to a vacuum source (not shown) through a suction passage (not shown) formed inside the holding table 14.

Figure 2B:
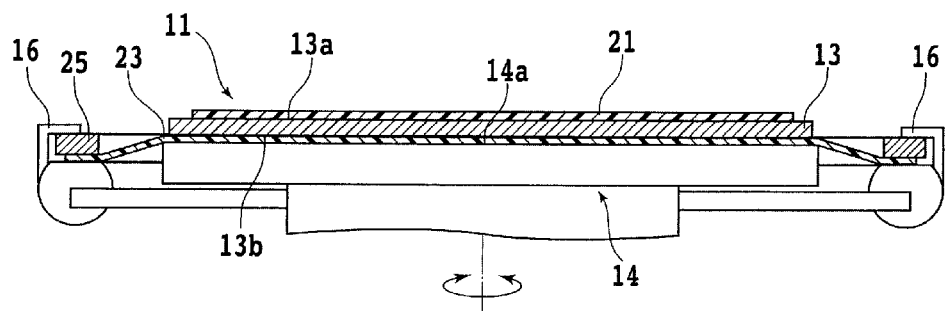
FIG. 2B is a partially sectional side view of the wafer shown in FIG. 2A in the condition where the wafer is held on a holding table under suction.

FIG. 2A is a schematic plan view of a wafer 11 to be processed in this preferred embodiment, and FIG. 2B is a partially sectional side view of the wafer 11 shown in FIG. 2A in the condition where the wafer 11 is held on the holding table 14 under suction. As shown in FIGS. 2A and 2B, the wafer 11 is a package wafer such as WL-CSP (Waver Level Chip Size Package), for example. The wafer 11 includes a disk-shaped base wafer 13 formed of a semiconductor material such as silicon. The base wafer 13 has a front side (upper surface) 13a and a back side (lower surface) 13b. A plurality of crossing division lines (streets) 15 are formed on the front side 13a of the base wafer 13 to thereby define a plurality of separate regions where a plurality of devices 17 such as ICs are formed. Each device 17 includes a key pattern (target pattern) 19 having a characteristic shape. The front side 13a of the base wafer 13 is sealed with a resin 21 in an area (central portion) except a peripheral portion, so that the devices 17 and the key patterns 19 in this area are not exposed. In contrast, the peripheral portion of the front side 13a is not covered with the resin 21, so that the devices 17 and the key patterns 19 in the peripheral portion of the front side 13a are exposed. As shown in FIG. 2B, a dicing tape 23 having a diameter larger than that of the wafer 11 is attached to the back side 13b of the base wafer 13. The dicing tape 23 is fixed at its peripheral portion to an annular frame 25. Accordingly, the wafer 11 is supported through the dicing tape 23 to the annular frame 25.

Referring back to FIG. 1, the cutting apparatus 2 includes a transfer mechanism (transfer means) (not shown) for transferring the wafer 11 to the holding table 14. The transfer mechanism is located in the vicinity of the opening 4b. The wafer 11 transferred by the transfer mechanism is placed on the holding table 14 in the condition where the front side 13a sealed with the resin 21 in the central portion is exposed upward.

A double column type support structure 20 for supporting a first cutting unit (first cutting means) 18a and a second cutting unit (second cutting means) 18b is provided on the upper surface of the base 4 so as to straddle the opening 4b. Two cutting unit moving mechanisms (indexing means) 22 for moving the first cutting unit 18a and the second cutting unit 18b both in the Y direction (indexing direction) shown by an arrow Y and in the Z direction are provided on the front surface of the support structure 20 at its upper portion. Each cutting unit moving mechanism 22 commonly include a pair of parallel Y guide rails 24 provided on the front surface of the support structure 20 and extending in the Y direction. A Y moving plate 26 constituting each cutting unit moving mechanism 22 is slidably mounted on the Y guide rails 24. A nut portion (not shown) is provided on the back side (rear surface) of each Y moving plate 26, and a Y ball screw 28 parallel to the Y guide rails 24 is threadedly engaged with this nut portion. A Y pulse motor 30 is connected to one end portion of each Y ball screw 28. Accordingly, when the Y pulse motor 30 is operated to rotate the Y ball screw 28 in each cutting unit moving mechanism 22, the Y moving plate 26 is moved in the Y direction along the Y guide rails 24 in each cutting unit moving mechanism 22.

A pair of parallel Z guide rails 32 extending in the Z direction are provided on the front side (front surface) of each Y moving plate 26. A Z moving plate 34 is slidably mounted on the Z guide rails 32 of each Y moving plate 26. A nut portion (not shown) is provided on the back side (rear surface) of each Z moving plate 34, and a Z ball screw 36 parallel to the Z guide rails 32 is threadedly engaged with this nut portion. A Z pulse motor 38 is connected to one end portion of each Z ball screw 36. Accordingly, when the Z pulse motor 38 is operated to rotate the Z ball screw 36 in each cutting unit moving mechanism 22, the Z moving plate 34 is moved in the Z direction along the Z guide rails 32 in each cutting unit moving mechanism 22.

The first and second cutting units 18a and 18b for cutting the wafer 11 are provided at the lower portions of the Z moving plates 34 of the two cutting unit moving mechanisms 22. Further, a camera (imaging means) 40 for imaging the upper surface (front side 13a) of the wafer 11 is provided at a position adjacent to the first cutting unit 18a. Accordingly, when the Y moving plate 26 is moved in the Y direction in the cutting unit moving mechanism 22 for moving the first cutting unit 18a, the first cutting unit 18a and the camera 40 are moved (indexed) together in the Y direction. Further, when the Z moving plate 34 is moved in the Z direction in the cutting unit moving mechanism 22 for moving the first cutting unit 18a, the first cutting unit 18a and the camera 40 are vertically moved together in the Z direction. Similarly, when the Y moving plate 26 is moved in the Y direction in the other cutting unit moving mechanism 22 for moving the second cutting unit 18b, the second cutting unit 18b is moved (indexed) in the Y direction. Further, when the Z moving plate 34 is moved in the Z direction in the other cutting unit moving mechanism 22 for moving the second cutting unit 18b, the second cutting unit 18b is vertically moved in the Z direction.

The first cutting unit 18a includes a spindle 42a (see FIG. 3) rotating about an axis extending in the Y direction and a first cutting blade 44a mounted on one end of the spindle 42a. The first cutting blade 44a has an annular shape. A rotational drive source (not shown) such as a motor is connected to the other end of the spindle 42a, thereby rotating the first cutting blade 44a fixed to the spindle 42a. Similarly, the second cutting unit 18b includes a spindle 42b (see FIG. 3) rotating about an axis extending in the Y direction and a second cutting blade 44b (see FIG. 3) mounted on one end of the spindle 42b. The second cutting blade 44b has an annular shape. A rotational drive source (not shown) such as a motor is connected to the other end of the spindle 42b, thereby rotating the second cutting blade 44b fixed to the spindle 42b. By lowering the first and second cutting blades 42a and 42b as rotating them so as to cut into the wafer 11, the first and second cut grooves can be formed in the wafer 11. The first cutting blade 44a has a thickness larger than that of the second cutting blade 44b. Accordingly, the width of the first cut groove to be formed by the first cutting blade 44a is larger than the width of the second cut groove to be formed by the second cutting blade 44b.

Referring back to FIG. 1, the upper surface of the base 4 is formed with a circular opening 4c at a position opposite to the opening 4a with respect to the opening 4b in the Y direction. A cleaning mechanism (cleaning means) 46 for cleaning the wafer 11 after cutting is provided in the opening 4c.

The wafer processing method using the cutting apparatus 2 mentioned above will now be described. First, the alignment step is performed to make the cutting apparatus 2 recognize the position of each division line 15 on the wafer 11. In the alignment step, the wafer 11 is first transferred to the holding table 14 by the transfer mechanism and placed on the holding table 14 in the condition where the resin 21 (front side 13a) is exposed upward. Thereafter, the vacuum produced in the vacuum source is applied to the holding table 14 to hold the wafer 11 on the holding table 14 under suction. Thereafter, the upper surface (front side 13a) of the wafer 11 is imaged by the camera 40. Thereafter, according to the coordinate information of the key patterns 19 preliminarily recorded and the image (detected image) of the wafer 11 formed by the camera 40, an arbitrary one of the key patterns 19 exposed at the peripheral portion of the wafer 11 and corresponding to a predetermined one of the division lines 15 is detected. Thereafter, the actual coordinates of the key pattern 19 detected above are calculated from the detected image. According to the actual coordinates of this key pattern 19, the orientation of the wafer 11 is adjusted so that the direction of the predetermined division line 15 becomes parallel to the X direction (feeding direction). More specifically, according to the actual coordinates of this key pattern 19 calculated above, a proper rotational angle is set for the holding table 14, and the holding table 14 is rotated by this angle. Since the distance between this key pattern 19 and the predetermined division line 15 is known, the position of the predetermined division line 15 can be identified by the cutting apparatus 2 by making the direction of the predetermined division line 15 parallel to the X direction.

Figure 3:
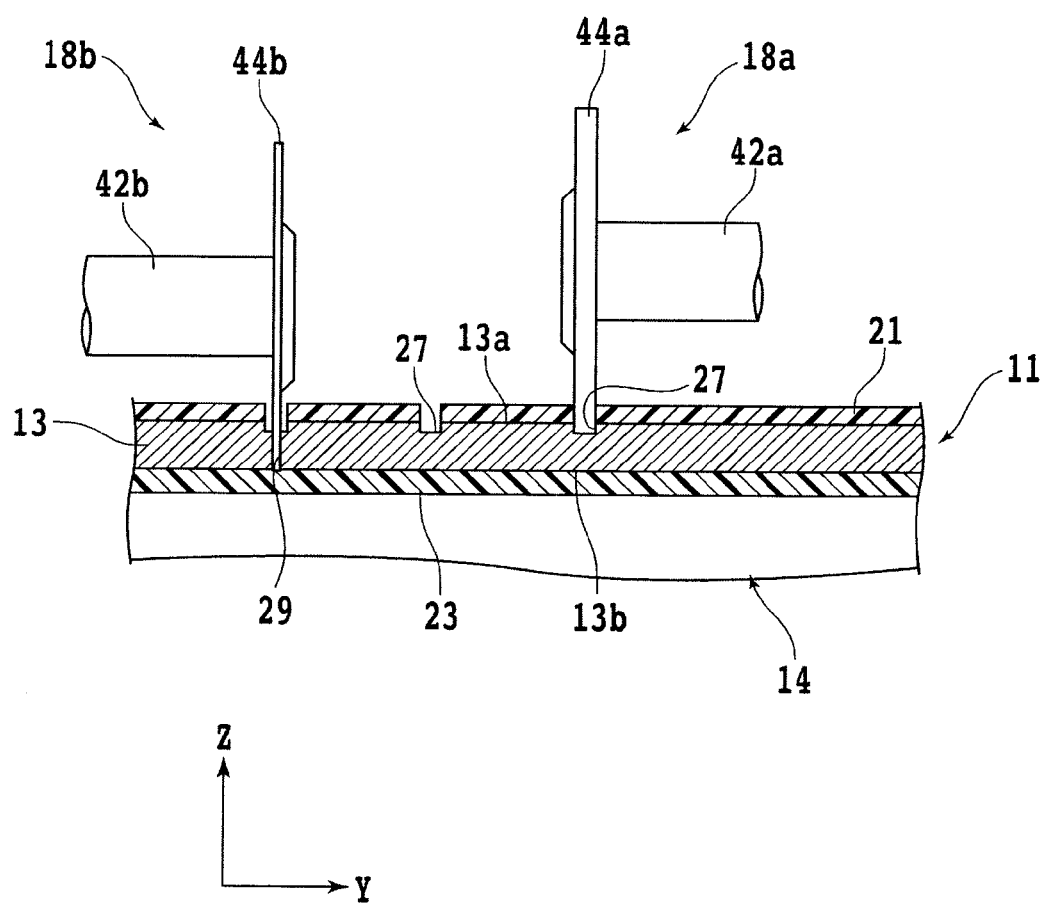
FIG. 3 is a partially sectional side view schematically showing a cutting step.

After performing the alignment step, the cutting step is performed to cut the wafer 11 along each division line 15. FIG. 3 is a partially sectional side view schematically showing the cutting step. In the cutting step, the first cutting blade 44a is first moved to a cutting start position for the predetermined division line 15 parallel to the X direction. Thereafter, the first cutting blade 44a is rotated and lowered until the lower end of the first cutting blade 44a reaches a vertical position between the front side 13a and the back side 13b of the base wafer 13. Thereafter, the holding table 14 is moved (fed) in the X direction. Accordingly, the wafer 11 is cut along the predetermined division line 15 by the first cutting blade 44a to thereby form a first cut groove 27 having a depth not reaching the back side 13b of the base wafer 13. Thereafter, the second cutting blade 44b is moved to a cutting start position for the first cut groove 27 formed above. Thereafter, the second cutting blade 44b is rotated and lowered until the lower end of the second cutting blade 44b reaches a vertical position lower than the back side 13b of the base wafer 13. Thereafter, the holding table 14 is moved (fed) in the X direction. Accordingly, the wafer 11 is further cut along the first cut groove 27 by the second cutting blade 44b to thereby form a second cut groove 29 having a depth of completely cutting the wafer 11.

After forming the first cut groove 27, the first cutting unit 18a is indexed in the Y direction by an index amount corresponding to the pitch of the division lines 15, thereby aligning the first cutting blade 44a with the next division line 15 adjacent to the previous division line 15 where the first cut groove 27 has already been formed. Similarly, after forming the second cut groove 29, the second cutting unit 18b is indexed in the Y direction by an index amount corresponding to the pitch of the division lines 15, thereby aligning the second cutting blade 44b with the next first cut groove 27 adjacent to the previous first cut groove 27 where the second cut groove 29 has already been formed. In this manner, the cutting (feeding) operation and the indexing operation are repeated to similarly form a plurality of first cut grooves 27 and a plurality of second cut grooves 29 along all of the division lines 15 parallel to the X direction.

Figure 4:
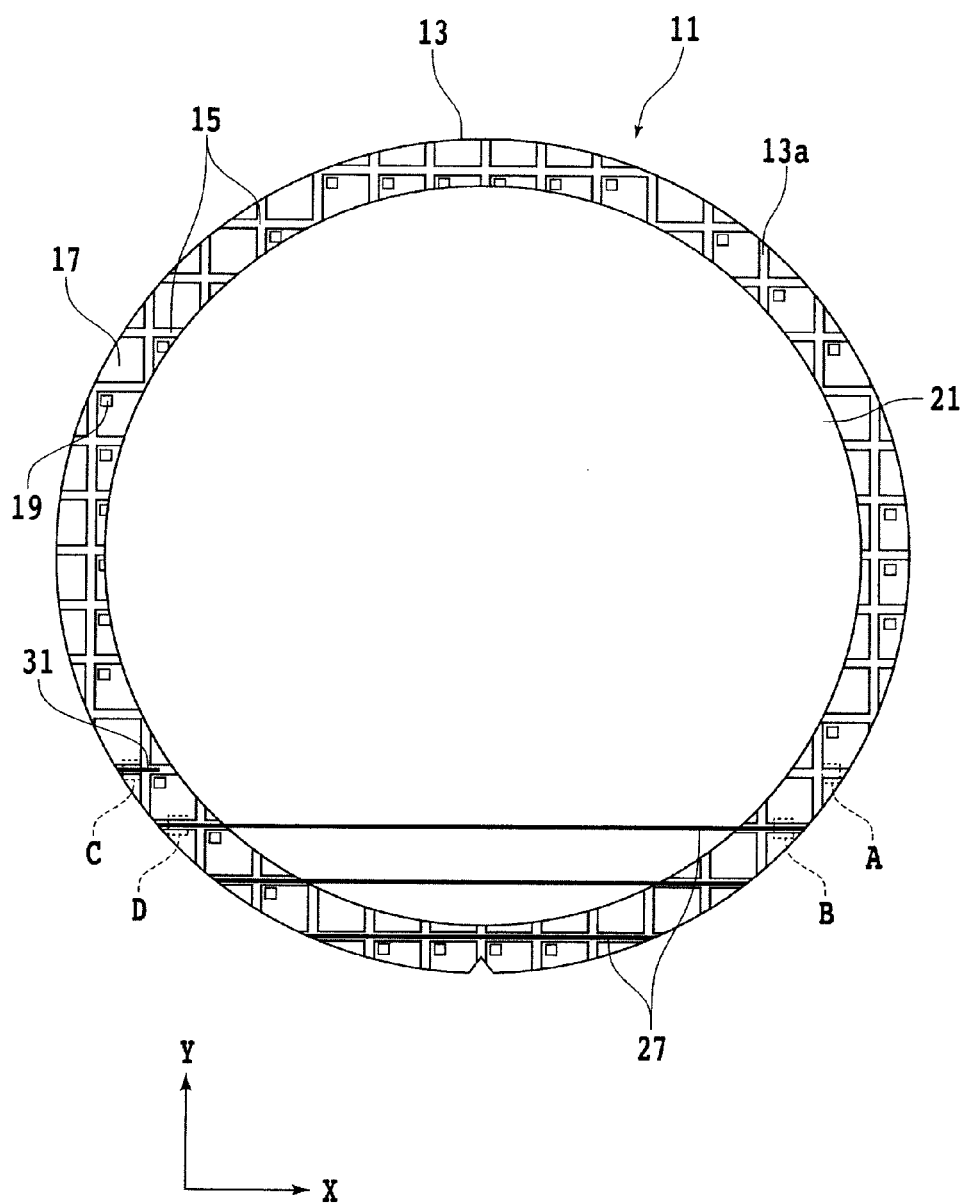
FIG. 4 is a plan view for illustrating a first correction step and a second correction step.
Figure 5A:
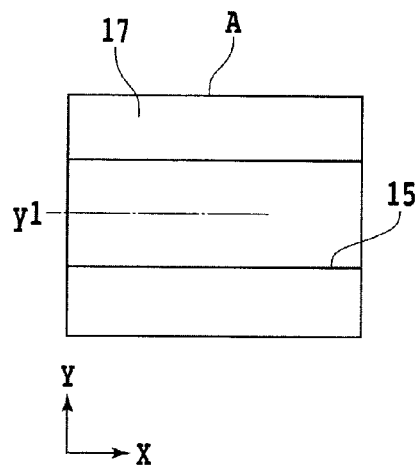
FIG. 5A is a plan view showing a detected image formed by imaging an area including a division line where a first cut groove is to be next formed.
Figure 5B:
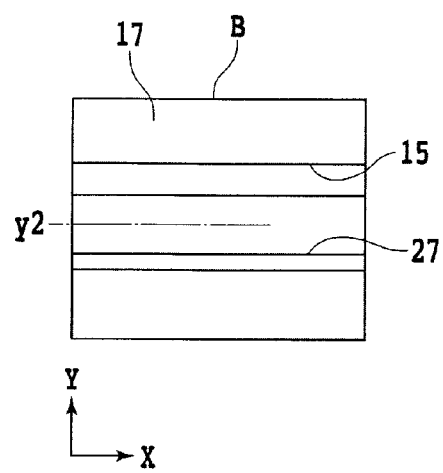
FIG. 5B is a plan view showing a detected image formed by imaging an area including the first cut groove previously formed.

With arbitrary timing during the cutting step, the first correction step is performed to correct the index amount of the first cutting unit 18a and the second correction step is also performed to correct the index amount of the second cutting unit 18b. FIG. 4 is a plan view for illustrating the first correction step and the second correction step. In the first correction step, the upper surface (front side 13a) of the wafer 11 is first imaged by the camera 40. More specifically, as shown in FIG. 4, an area A including the division line 15 where the first cut groove 27 is to be next formed and an area B including the first cut groove 27 adjacent to this division line 15 are imaged by the camera 40. FIG. 5A is a plan view showing a detected image formed by imaging the area A including the division line 15 where the first cut groove 27 is to be next formed, and FIG. 5B is a plan view showing a detected image formed by imaging the area B including the first cut groove 27. After imaging the area A and the area B, a center coordinate y1 dividing the width of the division line 15 into two equal parts in the Y direction is determined according to the detected image of the area A shown in FIG. 5A. Further, a center coordinate y2 dividing the width of the first cut groove 27 into two equal parts in the Y direction is determined according to the detected image of the area B shown in FIG. 5B. The reason why the center coordinate y1 can be directly determined by imaging the area A including the division line 15 is due largely to recent improvements in sensitivity and control software of the camera 40. Thereafter, the distance a (=y1−y2) between the division line 15 and the first cut groove 27 is determined from the center coordinate y1 of the division line 15 and the center coordinate y2 of the first cut groove 27. Then, the deviation b (=Y1−a) equivalent to the difference between a proper index amount Y1 of the first cutting unit 18a and the distance a is calculated. By using this deviation b, the actual index amount of the first cutting unit 18a is corrected. More specifically, for example, the deviation b is added to the actual index amount of the first cutting unit 18a.

Figure 5C:
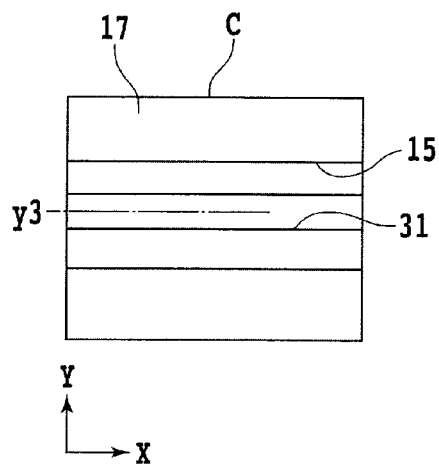
FIG. 5C is a plan view showing a detected image formed by imaging an area including a measurement groove.
Figure 5D:
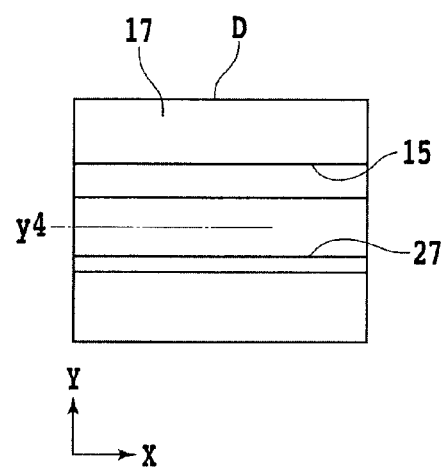
FIG. 5D is a plan view showing a detected image formed by imaging an area including the first cut groove previously formed.

In the second correction step, a measurement groove 31 is first formed along the division line 15 where the first cut groove 27 is to be next formed, by using the second cutting unit 18b as shown in FIG. 4. The measurement groove 31 is formed in the peripheral portion of the wafer 11 so as to have a length not interfering with the processing to be performed later. Thereafter, the upper surface (front side 13a) of the wafer 11 is imaged by the camera 40. More specifically, as shown in FIG. 4, an area C including the measurement groove 31 and an area D including the first cut groove 27 adjacent to this measurement groove 31 are imaged by the camera 40. FIG. 5C is a plan view showing a detected image formed by imaging the area C including the measurement groove 31, and FIG. 5D is a plan view showing a detected image formed by imaging the area D including the first cut groove 27. After imaging the area C and the area D, a center coordinate y3 dividing the width of the measurement groove 31 into two equal parts in the Y direction is determined according to the detected image of the area C shown in FIG. 5C. Further, a center coordinate y4 dividing the width of the first cut groove 27 into two equal parts in the Y direction is determined according to the detected image of the area D shown in FIG. 5D. Thereafter, the distance c (=y3−y4) between the measurement groove 31 and the first cut groove 27 is determined from the center coordinate y3 of the measurement groove 31 and the center coordinate y4 of the first cut groove 27. Then, the deviation d (=Y2−c) equivalent to the difference between a proper index amount Y2 of the second cutting unit 18b and the distance c is calculated. By using this deviation d, the actual index amount of the second cutting unit 18b is corrected. More specifically, for example, the deviation d is added to the actual index amount of the second cutting unit 18b.

In the wafer processing method according to this preferred embodiment as described above, the distance a between the first cut groove 27 previously formed and the division line 15 where the first cut groove 27 is to be next formed is measured, and the actual index amount of the first cutting unit (first cutting means) 18a is corrected by using the deviation b equivalent to the difference between the distance a and the proper index amount Y1 of the first cutting unit 18a. Accordingly, it is unnecessary to use the key patterns (target patterns) 19 in correcting the index amount of the first cutting unit 18a. Accordingly, even in the case of processing the wafer 11 having a small number of exposed key patterns 19, the index amount of the first cutting unit 18a can be corrected with arbitrary timing. Further, the distance a as the actual index amount of the first cutting unit 18a is directly measured without the use of the key patterns 19 by imaging the area near the division line 15. Accordingly, the index amount of the first cutting unit 18a can be corrected more reliably with high accuracy.

Further, in the wafer processing method according to this preferred embodiment as described above, the measurement groove 31 is formed along the division line 15 where the first cut groove 27 is to be next formed, by using the second cutting unit (second cutting means) 18b. Thereafter, the distance c between the first cut groove 27 previously formed and the measurement groove 31 is measured, and the actual index amount of the second cutting unit 18b is corrected by using the deviation d equivalent to the difference between the distance c and the proper index amount Y2 of the second cutting unit 18b. Accordingly, it is unnecessary to use the key patterns 19 in correcting the index amount of the second cutting unit 18b. Accordingly, even in the case of processing the wafer 11 having a small number of exposed key patterns 19, the index amount of the second cutting unit 18b can be corrected with arbitrary timing. Further, the distance c as the actual index amount of the second cutting unit 18b is directly measured without the use of the key patterns 19. Accordingly, the index amount of the second cutting unit 18b can be corrected more reliably with high accuracy.

As described above, according to the wafer processing method, even in the case of processing the wafer 11 having a small number of exposed key patterns 19, the index amount can be corrected with arbitrary timing and more reliably with high accuracy.

The present invention is not limited to the above preferred embodiment, but various modifications may be made. For example, while the wafer 11 used in this preferred embodiment is a package wafer, the present invention is also applicable to any wafer not sealed with resin.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for cutting a wafer by using a cutting apparatus, the front side of the wafer being partitioned by a plurality of crossing division lines into a plurality of separate regions where a plurality of devices are respectively formed, the cutting apparatus including:
a holding table configured to hold the wafer,
first cutting means having a first cutting blade for cutting the wafer held on the holding table,
second cutting means having a second cutting blade for cutting the wafer held on the holding table, wherein the second cutting blade has a thickness that is different from that of the first cutting blade,
feeding means for feeding the holding table in an X direction,
indexing means for indexing the first cutting means and the second cutting means in a Y direction perpendicular to the X direction according to the pitch of the division lines, and
imaging means for detecting a target area of the wafer to be cut, the wafer processing method comprising:
an alignment step of identifying the target area of the wafer held on the holding table by using the imaging means;
a cutting step of repeating a cutting operation by the first cutting means and the second cutting means with the feeding means and an indexing operation by the indexing means according to the pitch of the division lines after performing the alignment step, thereby forming a first cut groove of a first width along each division line by using the first cutting means and forming a second cut groove of a second width along the first cut groove by using the second cutting, wherein the first width is different from the second width;
a first cutting means correction step of measuring a distance "a" between the first cut groove previously formed and each division line where the first cut groove is to be next formed, and correcting an actual index amount of the first cutting means by using a deviation "b" of the first cutting means equivalent to the difference between the distance "a" and a proper index amount of the first cutting means during the cutting step; and
a second cutting means correction step of forming a measurement groove by using the second cutting means along each division line where the first cut groove is to be next formed, measuring a distance "c" between the first cut groove previously formed and the measurement groove, and correcting an actual index amount of the second cutting means by using a deviation "d" of the second cutting means equivalent to the difference between the distance "c" and a proper index amount of the second cutting means during the cutting step.

2. The wafer processing method according to claim 1, wherein the measurement groove is formed at only a peripheral portion of the wafer in the second cutting means correction step.

3. A wafer processing method for cutting a wafer by using a cutting apparatus, the front side of the wafer being partitioned by a plurality of crossing division lines into a plurality of separate regions where a plurality of devices are respectively formed, the cutting apparatus including:
a holding table configured to hold the wafer,
first cutting means having a first cutting blade for cutting the wafer held on the holding table,
second cutting means having a second cutting blade for cutting the wafer held on the holding table,
feeding means for feeding the holding table in an X direction,
indexing means for indexing the first cutting means and the second cutting means in a Y direction perpendicular to the X direction according to the pitch of the division lines, and
imaging means for detecting a target area of the wafer to be cut, the wafer processing method comprising:
an alignment step of identifying the target area of the wafer held on the holding table by using the imaging means;
a cutting step of repeating a cutting operation by the first cutting means and the second cutting means with the feeding means and an indexing operation by the indexing means according to the pitch of the division lines after performing the alignment step, thereby forming a first cut groove along each division line by using the first cutting means and forming a second cut groove along the first cut groove by using the second cutting means;
a first cutting means correction step of measuring a distance "a" between the first cut groove previously formed and each division line where the first cut groove is to be next formed, and correcting an actual index amount of the first cutting means by using a deviation "b" of the first cutting means equivalent to the difference between the distance "a" and a proper index amount of the first cutting means during the cutting step; and
a second cutting means correction step of forming a measurement groove by using the second cutting means along each division line where the first cut groove is to be next formed, measuring a distance "c" between the first cut groove previously formed and the measurement groove, and correcting an actual index amount of the second cutting means by using a deviation "d" of the second cutting means equivalent to the difference between the distance "c" and a proper index amount of the second cutting means during the cutting step, wherein the wafer is a package wafer composed of a base wafer and a resin layer sealing the front side of the base wafer in an area except a peripheral portion, the division lines being partially exposed in the peripheral portion of the base wafer so that the division lines can be imaged by the imaging means.

4. The wafer processing method according to claim 1, wherein the first width of the first cut grove is greater than the second width of the second cut groove.

5. The wafer processing method according to claim 3, wherein a first width of the first cut grove is greater than a second width of the second cut groove.

\* \* \* \* \*